(12) United States Patent
Iwasaki et al.

(10) Patent No.: US 6,373,873 B1
(45) Date of Patent: Apr. 16, 2002

(54) MICROWAVE EXCITATION GAS LASER OSCILLATING APPARATUS

(75) Inventors: Yutaka Iwasaki, Mino; Masahiko Kubo, Takarazuka, both of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/121,597

(22) Filed: Jul. 24, 1998

(30) Foreign Application Priority Data

Jul. 31, 1997 (JP) .............................. 9-205108

(51) Int. Cl.[7] .................................................. H01S 3/10
(52) U.S. Cl. .................................................... 372/38.02
(58) Field of Search .............................. 372/38.1, 38.02

(56) References Cited

U.S. PATENT DOCUMENTS

| | | | | |
|---|---|---|---|---|
| 4,825,028 A | * | 4/1989 | Smith et al. | 219/10.55 B |
| 4,835,353 A | * | 5/1989 | Smith et al. | 219/10.55 B |
| 5,021,620 A | | 6/1991 | Inumada | 219/10.55 B |

FOREIGN PATENT DOCUMENTS

| EP | 0 301 805 A1 | 2/1989 |
|---|---|---|
| EP | 0 674 369 A1 | 9/1995 |

OTHER PUBLICATIONS

Patent Abstracts of Japan; vol. 5, No. 74 (E–57) '746!, May 16, 1981 & JP 56 024738 A (Hitachi), Mar. 9, 1981 *abstract*.

* cited by examiner

Primary Examiner—James W. Davie
(74) Attorney, Agent, or Firm—Parkhurst & Wendel, L.L.P.

(57) ABSTRACT

Based on an oscillation ON/OFF signal and an output state instruction signal output to a high-voltage generating circuit (101) from a power supply control apparatus (301), heater voltage applied from a heater circuit (201) to a heater of a magnetron (2) is controlled depending on whether the magnetron (2) is stopped from oscillating or is continuously or intermittently operating. The heater voltage of the magnetron (2) measured during the intermittent operation is controlled to be higher than that measured during the continuous output and to be lower than that measured while the oscillation is stopped, thereby reducing the change in temperature of the heater and providing a lower limit temperature at which the magnetron (2) can oscillate stably. This configuration increases the service life of the magnetron (2) used for a microwave excitation laser.

3 Claims, 12 Drawing Sheets

MICROWAVE EXCITATION GAS LASER OSCILLATING APPARATUS

FIELD OF THE INVENTION

The present invention relates to a microwave gas laser oscillating apparatus for providing microwave discharge excitation.

BACKGROUND OF THE INVENTION

There is a recent tendency to miniaturize gas laser oscillating apparatuses, and to do this, attempts are made to increase the excitation frequency. Conventional power supplies for gas laser oscillators use DC and a high frequency between several 100 kHz and several 10 MHZ but have problems in costs and controllability.

Various microwave excitation gas laser oscillators are now examined, and an example is explained with reference to FIG. 12. This figure shows a configuration of a microwave power supply apparatus for a conventional microwave excitation laser oscillating apparatus.

In FIG. 12, reference numeral 3 is a heater transformer in a heater circuit 1 for applying a heater voltage to a heater section of a magnetron 2 that generates microwaves; 4 is a high-voltage generating circuit for applying a high voltage to a cathode and an anode of the magnetron 2 and to which a high voltage is applied from a switching circuit 5 via a step-up transformer 6 and a high-voltage rectifying circuit 7.

In a microwave power supply apparatus of this configuration, the switching circuit 5 applies about 20 kHz of switching operation to an input DC voltage, which is then applied to the step-up transformer 6. The step-up transformer 6 has its voltage increased up to a value required for oscillate the magnetron 2, rectified by the high-voltage rectifying circuit 7, and then applied to the cathode and anode of the magnetron 2. The heater transformer 3 reduces a commercial 200 VAC or 100 VAC and directly applies it to the heater section of the magnetron 2.

In this configuration, the variation of the commercial voltage is directly reflected in the variation of the heater voltage, but the output from the magnetron 2 does not vary if the heater voltage is within a specified variation range. In addition, the specified value of the variation of the heater voltage is within the variation range of the commercial voltage, and no effect appears in the output from the magnetron 2.

However, no microwave power supply apparatuses of the conventional configuration have means for detecting abnormal oscillation caused by the degradation of the magnetron 2, so the decrease in laser optical output during the abnormal oscillation of the magnetron 2 is a problem. In addition, the magnetron 2 may be degraded in a short time, resulting in short maintenance cycles.

DISCLOSURE OF THE INVENTION

It is thus an object of this invention to prevent abnormal oscillation of the magnetron and to detect degradation of the magnetron in order to increase its service life.

To achieve this object, the present invention comprises a discharge tube that excites a gas by means of discharge to generate a laser light, a magnetron that supplies microwaves to the discharge tube, and a microwave power supply apparatus for supplying power to the magnetron, wherein the microwave power supply apparatus has a heater circuit for applying heater voltage to the heater of the magnetron, and a high-voltage generating circuit for applying a high voltage between the anode and cathode of the magnetron, and wherein the heater circuit controls the heater voltage output to the magnetron from the heater circuit depending on whether the magnetron is stopped from oscillating or is providing a continuous output or an intermittent output.

According to this configuration, the heater temperature varies to a small extent and the heater voltage is controlled at a lower limit value at which the magnetron can oscillate stably, so that the magnetron can oscillate stably and its service life can be increased.

In another embodiment, the invention comprises a discharge tube that excites a gas by means of discharge to generate a laser light, a magnetron that supplies microwaves to the discharge tube, and a microwave power supply apparatus for supplying power to the magnetron, wherein the microwave power supply apparatus comprises a heater circuit for applying heater voltage to the heater of the magnetron, a high-voltage generating circuit for applying a high voltage between the anode and cathode of the magnetron, and an abnormal-voltage detecting circuit for detecting abnormal oscillation of the magnetron through an abnormal voltage generated in an abnormal-voltage-detecting winding provided in a step-up transformer constituting the high-voltage generating circuit.

According this configuration, abnormal voltage generated during abnormal oscillation is detected through the winding of the step-up transformer in order to detect the abnormal oscillation of the magnetron by means of the abnormal-voltage detecting circuit.

In another embodiment, the invention comprises a discharge tube that excites a gas by means of discharge to generate a laser light, a magnetron that supplies microwaves to the discharge tube, and a microwave power supply apparatus for supplying power to the magnetron, wherein the microwave power supply apparatus comprises a heater circuit for applying heater voltage to the heater of the magnetron, a high-voltage generating circuit for applying a high voltage between the anode and cathode of the magnetron, and an abnormal-voltage detecting circuit for detecting a defect in the heater section of the magnetron by detecting an abnormal voltage through a heater-voltage-detecting monitor winding provided in a heater transformer constituting the heater circuit.

This configuration allows it to accurately detect a defect in the heater circuit of the magnetron by detecting a decrease in the heater voltage of the magnetron caused by the lack of the oscillation of the magnetron caused by a short or an open circuit in the heater of the magnetron.

In another embodiment, the invention comprises a discharge tube that excites a gas by means of discharge to generate a laser light, a magnetron that supplies microwaves to the discharge tube, and a microwave power supply apparatus for supplying power to the magnetron, wherein the microwave power supply apparatus comprises a heater circuit for applying heater voltage to the heater of the magnetron, a high-voltage generating circuit for applying high voltage between the anode and cathode of the magnetron, a current detecting element that detects current flowing between the anode and cathode of the magnetron, and an abnormal-current detecting circuit which operates, when detecting that the current value of the current detecting element is abnormal, to stop the operation of only the abnormal microwave power supply.

According to this configuration, the current detecting element detects the current flowing between the anode and the cathode in order that the abnormal-current detecting circuit can stop the operation of the abnormal microwave power supply.

In another embodiment, the invention comprises a discharge tube that excites a gas by means of discharge to generate a laser light, a magnetron that supplies microwaves to the discharge tube, and a microwave power supply apparatus for supplying power to the magnetron, wherein the microwave power supply apparatus comprises a heater circuit for applying a heater voltage to the heater of the magnetron, a high-voltage generating circuit for applying a high voltage between the anode and cathode of the magnetron, abnormal-oscillation detecting means for detecting the abnormal oscillation of the magnetron, and a heater voltage instructing circuit which operates, when the abnormal-oscillation detecting means detects abnormal oscillation of the magnetron, to gradually increase the heater voltage, to store in the heater circuit a heater voltage at which the abnormal oscillation stops, and to output an instruction signal for operation at that heater voltage.

According to this configuration, when abnormal oscillation occurs, the abnormal oscillation is stopped in a short time by increasing the heater voltage and at this heater voltage at which the oscillation is stopped, operation is carried out, so that stable oscillation can be secured even though the magnetron degrades.

DESCRIPTION OF THE EMBODIMENTS (Embodiment 1)

Figure 1:
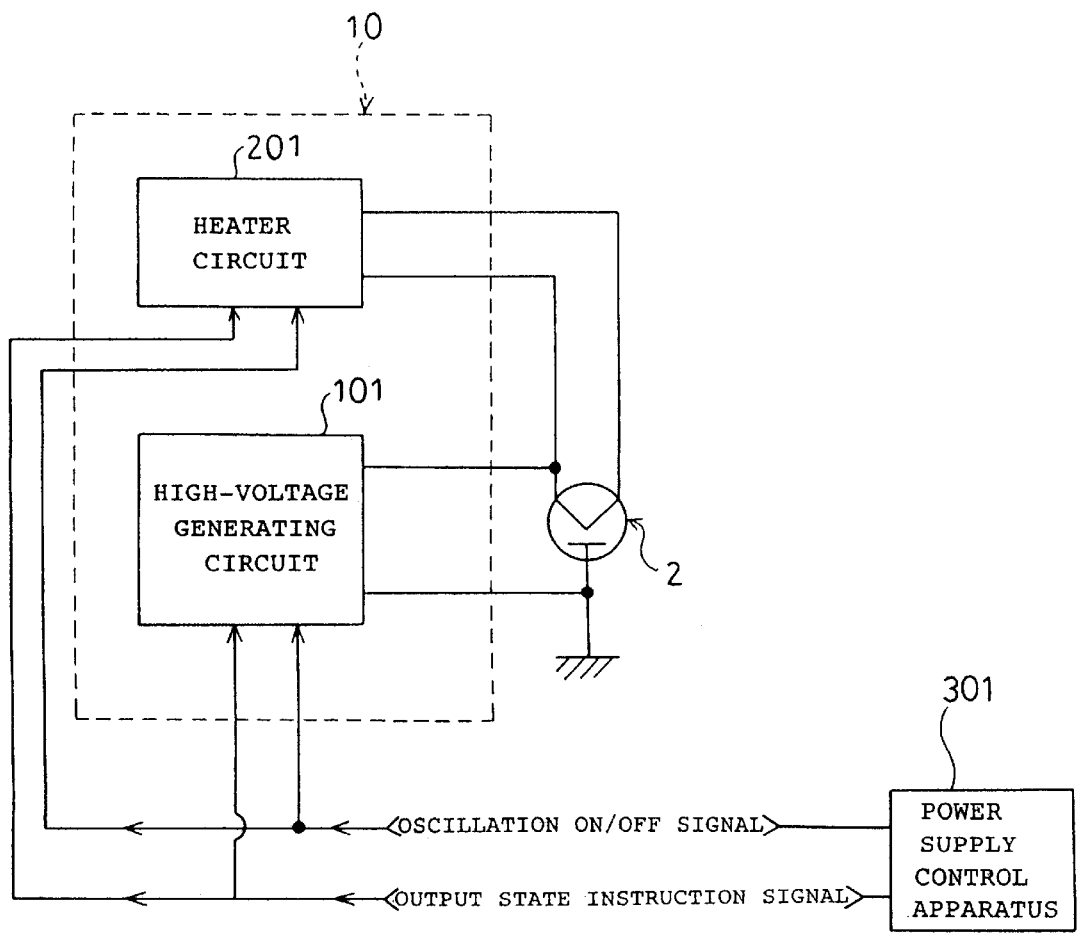
FIG. 1 is a block diagram showing a microwave power supply apparatus for a gas laser oscillating apparatus according to Embodiment 1 of this invention.

Embodiment 1 according to this invention is described with reference to FIGS. 1 to 3.

A microwave power supply apparatus 10 has a heater circuit 201 for applying a heater voltage to a heater section of the magnetron 2; and a high-voltage generating circuit 101 for applying a high voltage between an anode and a cathode of the magnetron 2. The high-voltage generating circuit 101 has input thereto an oscillation ON/OFF signal that determines whether to turn the oscillation of the magnetron 2 on or off and an output state instruction signal that determines the output state (continuous and intermittent outputs) of the magnetron 2. The high-voltage generating circuit 101 generates a high voltage only when both the oscillation ON/OFF signal and the output state instruction signal are at a high level, and applies it to the magnetron 2 for oscillation. In addition, the oscillation ON/OFF signal and the output state instruction signal are input to the heater circuit 201 from a power supply control device 301, and the heater circuit 201 varies the heater voltage based on the oscillation ON/OFF signal and the output state instruction signal.

Whether the magnetron 2 oscillates stably depends on whether the a sufficient heater voltage has been applied to allow the heater temperature to reach a value at which the magnetron can oscillate, provided a load state is constant. To reduce the degradation of the magnetron 2, operation must be performed at a possibly minimum heater temperature and with a possibly minimum change in heater temperature caused by the activation or deactivation of oscillation.

Figure 2:
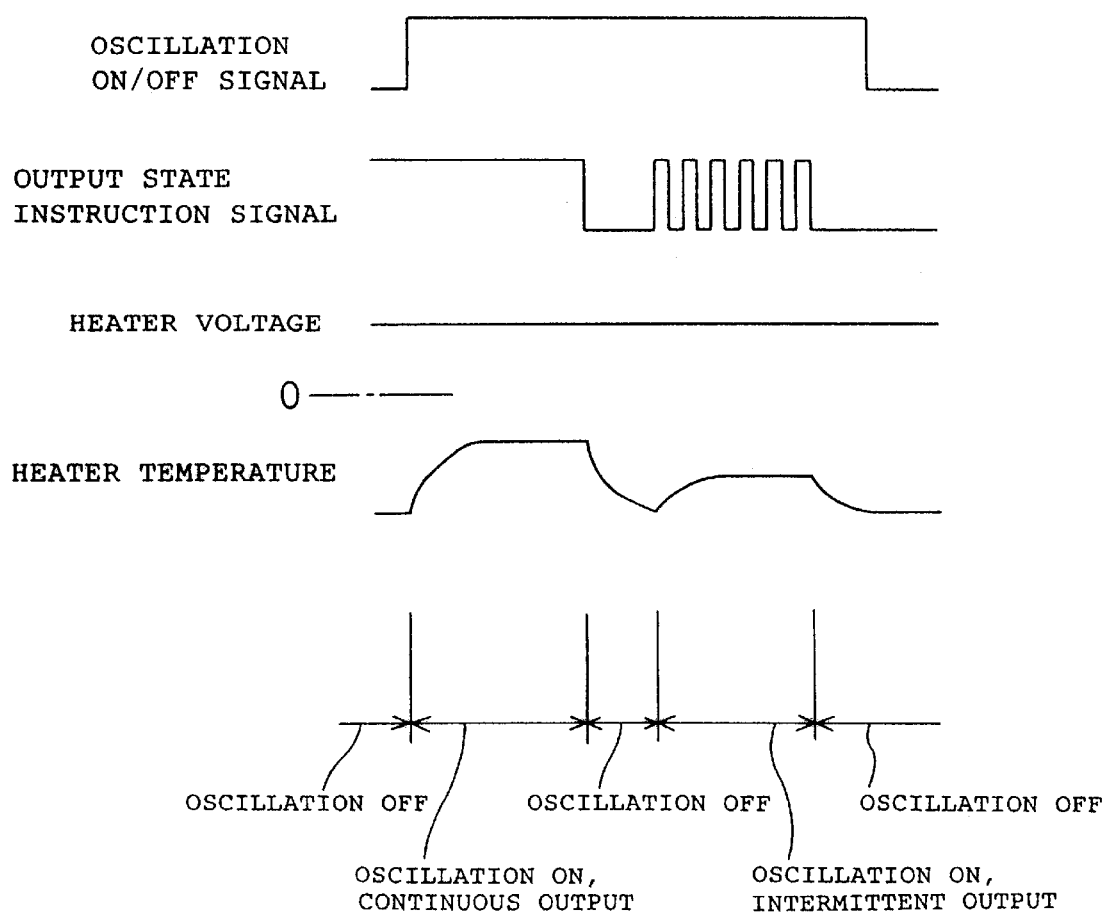
FIG. 2 is a waveform diagram showing changes in heater temperature when the heater voltage of the microwave power supply apparatus is constant.

FIG. 2 shows the heater temperature when the heater voltage is constant. While the oscillation of the magnetron 2 is stopped, the heater temperature corresponds to a set heater voltage. In addition, when the magnetron 2 is continuously oscillating, the oscillation causes the heater to be heated to increase the heater temperature. In addition, the thermal constant of the heater is generally about three seconds, and the time required for the heater temperature to stabilize depends on the thermal constant. Then, the magnetron 2 is intermittently oscillated, the heater temperature increases as in the continuous oscillation. The magnetron 2, however, is subjected to a repetition of the activation and deactivation of oscillation, so the heater temperature depends on the time ratio of the activation and deactivation of oscillation.

Figure 3:
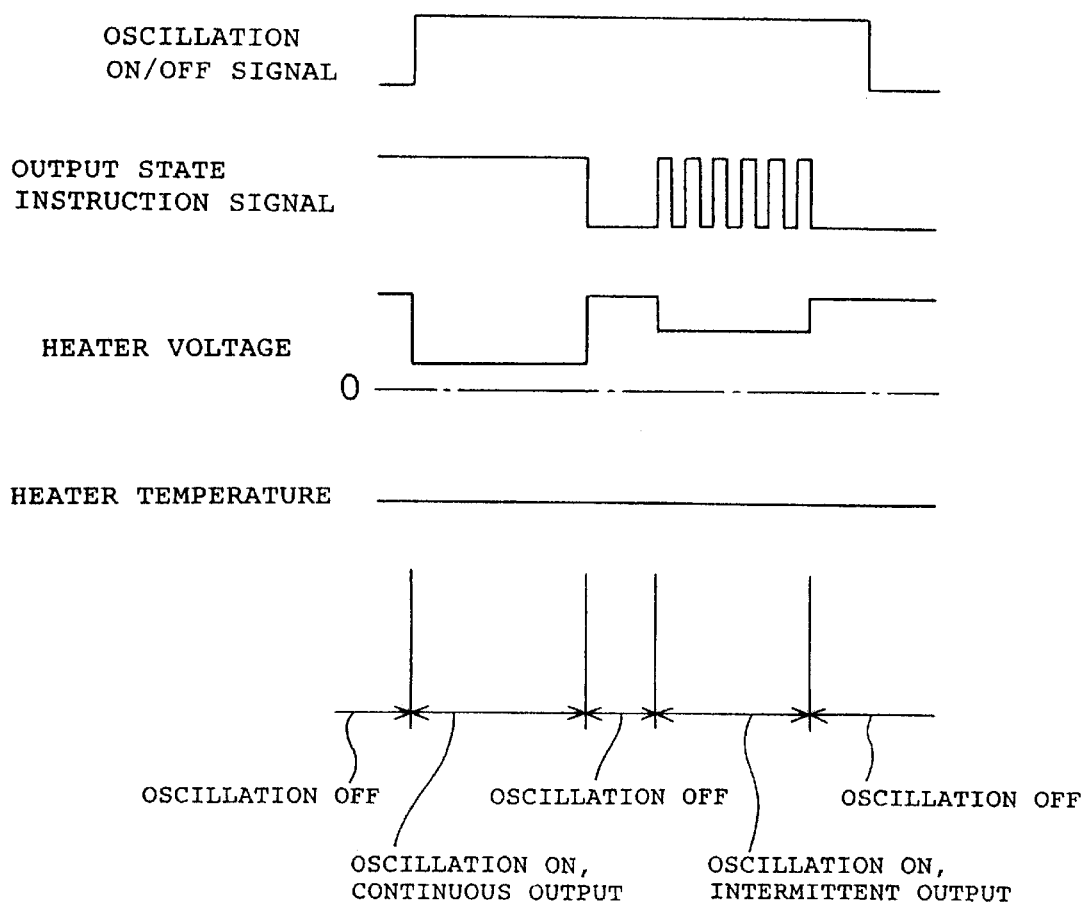
FIG. 3 is a waveform diagram showing that the heater voltage of the microwave power supply apparatus is controlled to maintain a constant heater temperature.
Figure 4:
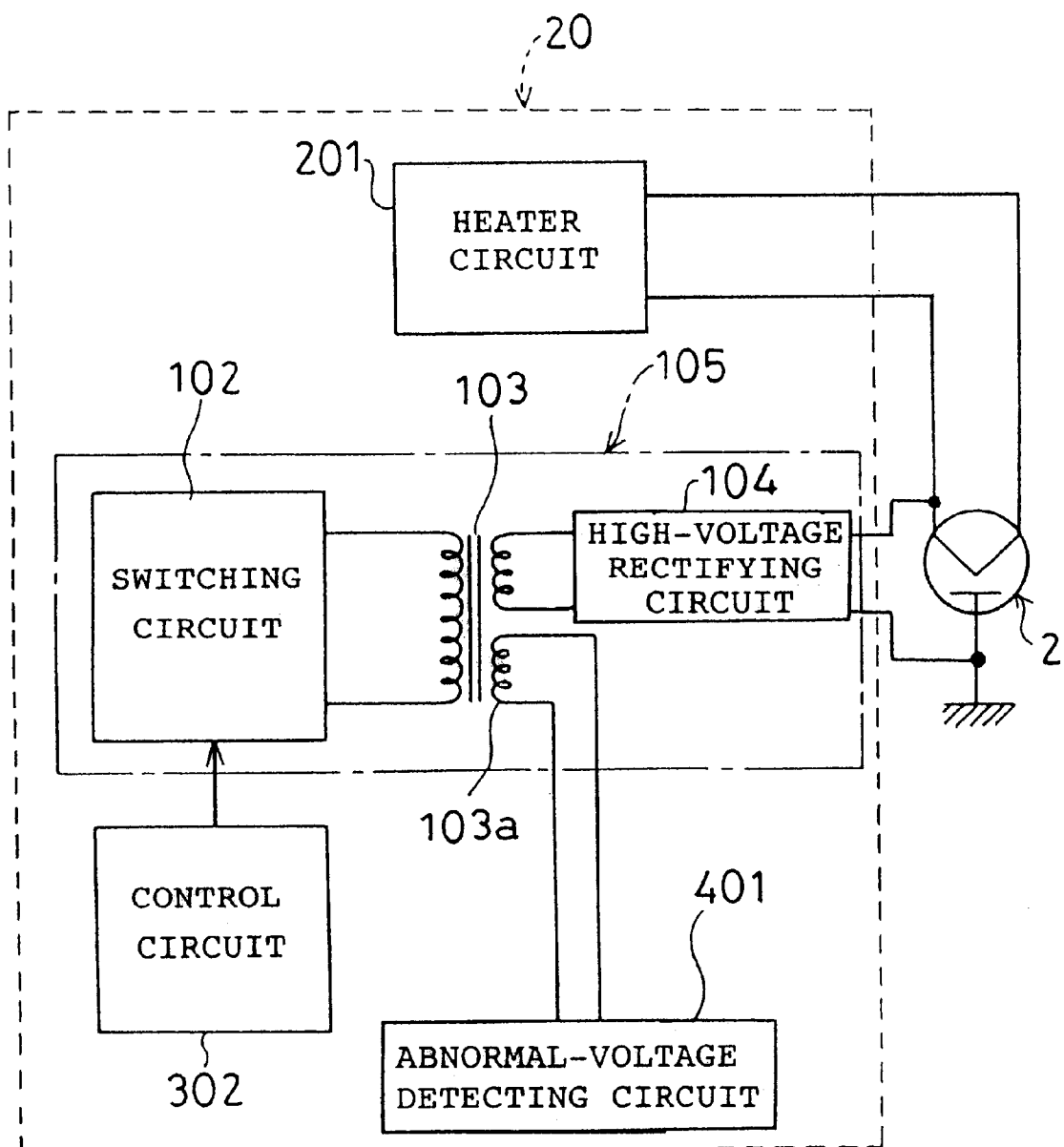
FIG. 4 is a block diagram showing a microwave power supply apparatus for a gas laser oscillating apparatus according to Embodiment 2 of this invention.

FIG. 3 shows that the output state of the magnetron 2 is used to control the heater voltage so that the heater temperature remains constant. If the heater voltage is constant, the heater temperature increases when the oscillation of the magnetron 2 is turned on, but by reducing the heater voltage, the increase in heater temperature caused by the oscillation is canceled to allow the heater temperature to become the same as that measured while the magnetron 2 is not oscillating. In addition, while the magnetron 2 is providing an intermittent output, the heater temperature is maintained at a constant value regardless of the operational state of the magnetron 2 by reducing the heater voltage below the value measured while the magnetron 2 is not oscillating and above the value measured during the continuous output of the magnetron 2.

According to Embodiment 1, based on an oscillation ON/OFF signal and an output state instruction signal from the power supply control apparatus 301, the heater circuit 201 controls the heater voltage so as to correspond to the operational state of the magnetron 2 in order to reduce the change in heater temperature, thereby increasing the service life of the magnetron 2. In addition, since the heater voltage is set so that the heater temperature has a lower limit value at which the magnetron 2 oscillates stably, the magnetron 2 can be oscillated stably to increase its service life.

Furthermore, during the continuous oscillation of the magnetron 2, the heater circuit 201 reduces the heater voltage based on the oscillation ON/OFF signal and output state instruction signal output from the power supply control apparatus 301. Thus, a large increase in heater temperature can be restrained to reduce the change in temperature, thereby allowing the magnetron 2 to oscillate stably and increasing its service life.

Furthermore, during the intermittent oscillation of the magnetron 2, the heater circuit 201 reduces the heater voltage based on the oscillation ON/OFF signal and output state instruction signal output from the power supply control apparatus 301. Thus, the heater temperature, which becomes higher than when oscillation is stopped, can be reduced to reduce the change in temperature, thereby allowing the magnetron 2 to oscillate stably and increasing its service life.

In addition, by setting the heater voltage in such a way that it is high during continuous output, that it has an intermediate value during intermittent output, and that it is lowest during a stop, the change in the heater temperature can be reduced and the magnetron 2 can be stably oscillated to increase the service life of the magnetron 2.

(Embodiment 2)

Embodiment 2 of this invention is described below with reference to FIGS. 4 to 7. The same members as in the preceding embodiment have the same reference numerals and their description is omitted.

A microwave power supply apparatus 20 has a heater circuit 201 for applying a heater voltage to the heater section of the magnetron 2; and a high-voltage generating circuit 105 for applying a high voltage between the anode and cathode of the magnetron 2. The high-voltage generating circuit 105 has a step-up transformer 103 that increases a voltage switched by a switching circuit 102, up to a value at which oscillation can occur. The voltage that has been increased by the step-up transformer 103 is rectified by a high-voltage rectifying circuit 104 and then applied between the anode and cathode of the magnetron 2.

The step-up transformer 103 has a tertiary winding 103$a$ that is an abnormal-voltage-detecting winding for detecting an abnormal voltage caused by the abnormal oscillation of the magnetron 2; and an abnormal-voltage detecting circuit 401 for determining the degradation of the magnetron 2 from an abnormal voltage of the tertiary winding 103$a$ to activate a display device such as a built-in alarm. Reference numeral 302 designates a control circuit that can stop the microwave power supply apparatus 20 based on a signal from the display device.

Figure 5:
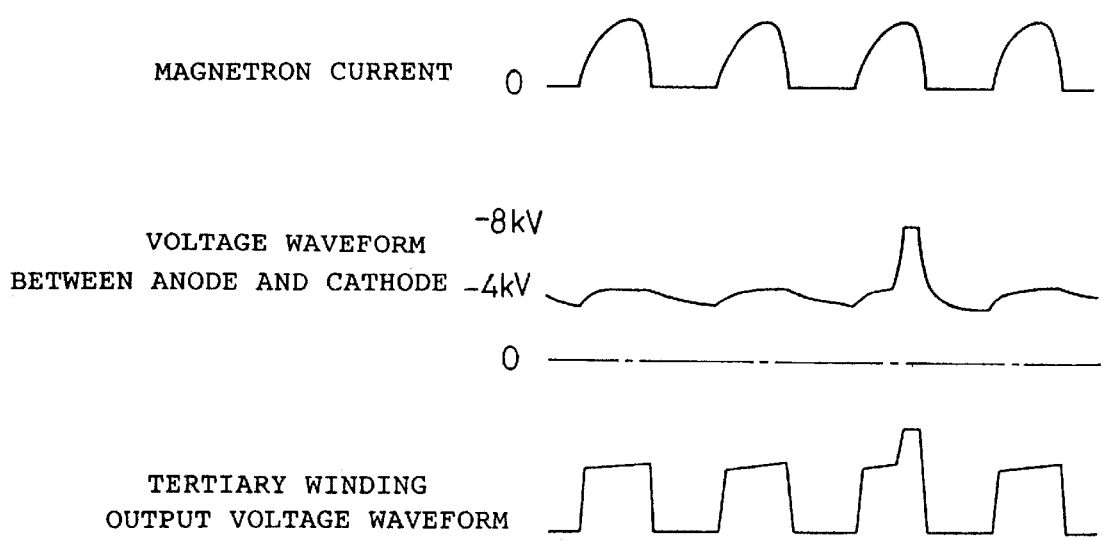
FIG. 5 is a waveform diagram showing the voltage between the cathode and anode of the microwave power supply apparatus, a current, and an output waveform from a tertiary winding in a step-up transformer.
Figure 6:
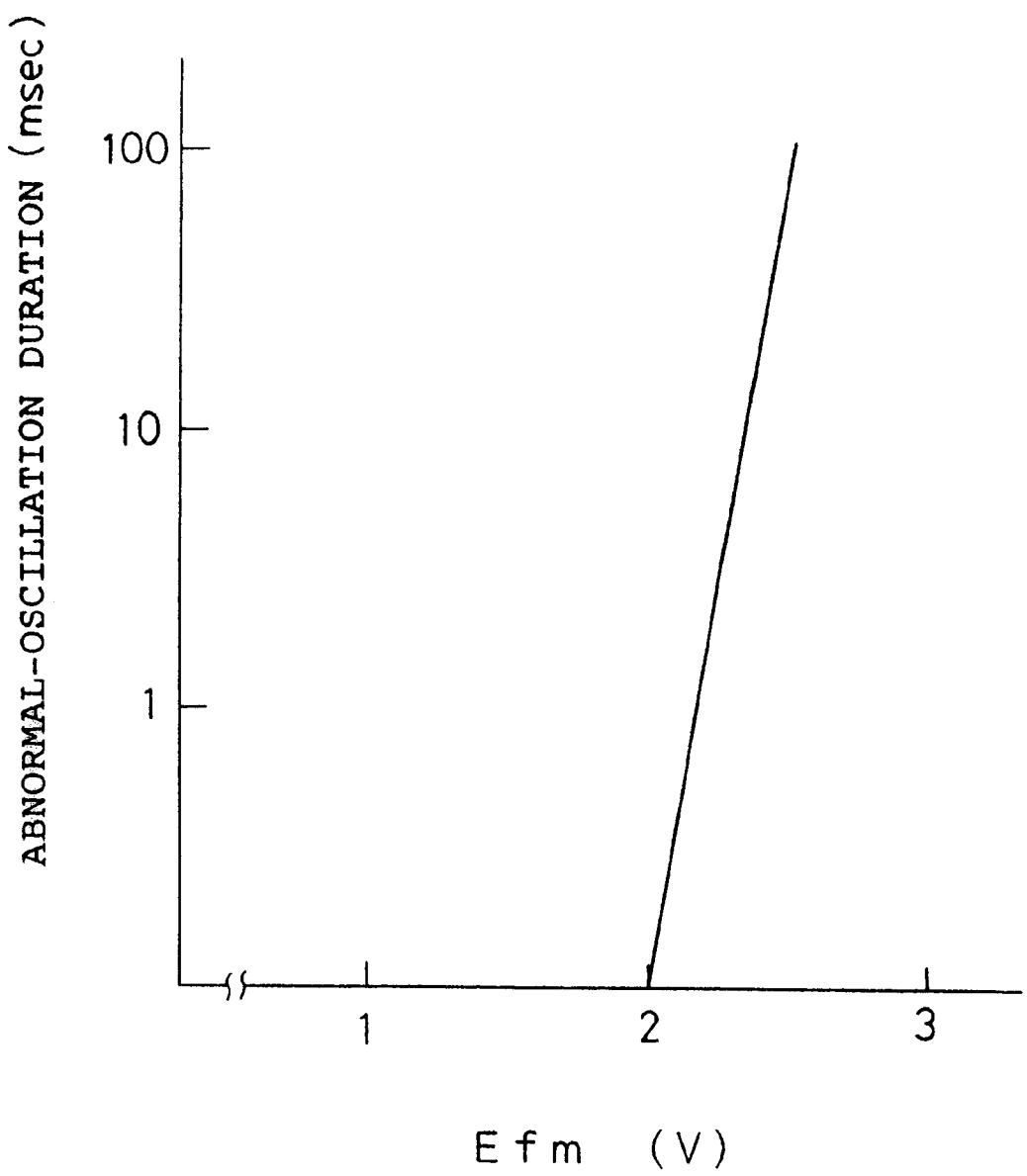
FIG. 6 is a characteristic diagram showing Efm and abnormal-oscillation duration of the microwave power supply apparatus.
Figure 7:
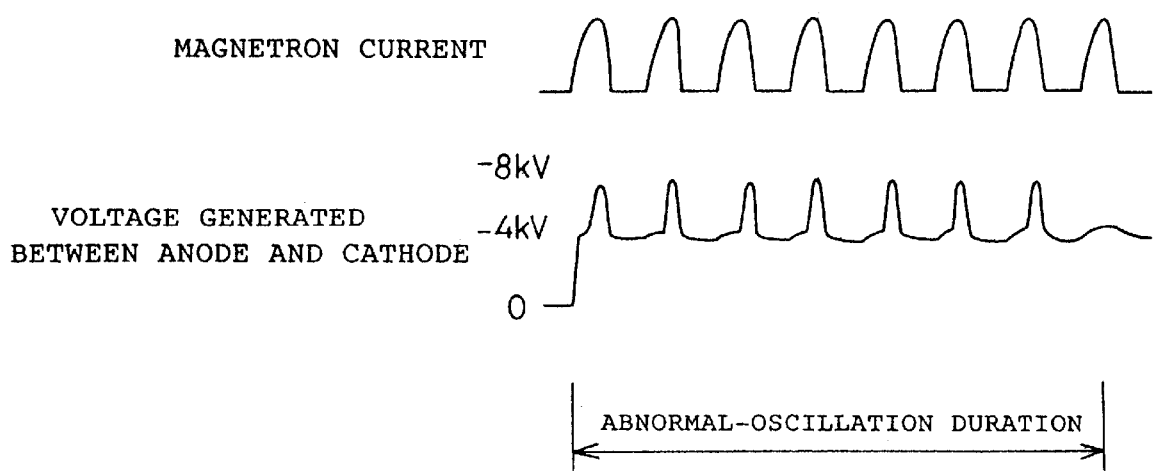
FIG. 7 is a waveform diagram showing the definition of an abnormal-oscillation duration during each switching cycle of the microwave power supply apparatus.

FIG. 5 shows a magnetron current flowing between the anode and cathode of the magnetron 2, the waveform of a voltage between the anode and cathode of the magnetron 2, and the waveform of an output voltage from the tertiary winding 103$a$. The magnetron current performs a pulsating operation corresponding to the switching cycle of the switching circuit 102 and has an off period of time during which no current flows. When the magnetron 2 oscillates abnormally, an abnormal voltage is generated that is 1.5 times to twice as large as the normal value. At this point, an abnormal voltage is generated in the tertiary winding 103$a$. The abnormal voltage can be detected by the abnormal-voltage detecting circuit 401 to detect the abnormal oscillation of the magnetron 2. In addition, FIG. 6 shows Efm, which is a parameter indicating the service life of the magnetron 2, and an abnormal-oscillation duration upon the activation of the magnetron 2. The abnormal-oscillation duration refers to a period of time over which an abnormal voltage lasts that is generated between the anode and cathode of the magnetron 2 during each switching cycle as shown in FIG. 7. A larger Efm indicates that the magnetron 2 is degraded. In addition, the magnetron 2 is most likely to undergo abnormal oscillation upon activation, and if the abnormal oscillation lasts, the internal loss of the magnetron causes the heater temperature to increase, thereby allowing the magnetron to return to normal oscillation.

The abnormal-voltage detecting circuit 401 assumes that the magnetron 2 is degraded, based on the duration of the abnormal oscillation. If the abnormal oscillation continues over a set period of time, the circuit 401 displays an alarm to inform that the magnetron 2 is degraded. When this alarm is provided, the control circuit 302 stops the microwave power supply apparatus 20.

According to Embodiment 2, the tertiary winding 103$a$ provided in the step-up transformer 2 can detect the abnormal oscillation of the magnetron 2, and the abnormal-voltage detecting circuit 401 can accurately assume the degradation of the magnetron 2 to allow efficient maintenance.

In addition, since the abnormal-voltage detecting circuit 401 has the display device for generating an abnormality alarm signal if the abnormal voltage lasts over a set period of time; and the control circuit 302 that can stop the microwave power supply apparatus 20, the lifetime service life of the magnetron 2 can be automatically detected.

(Embodiment 3)

Figure 8:
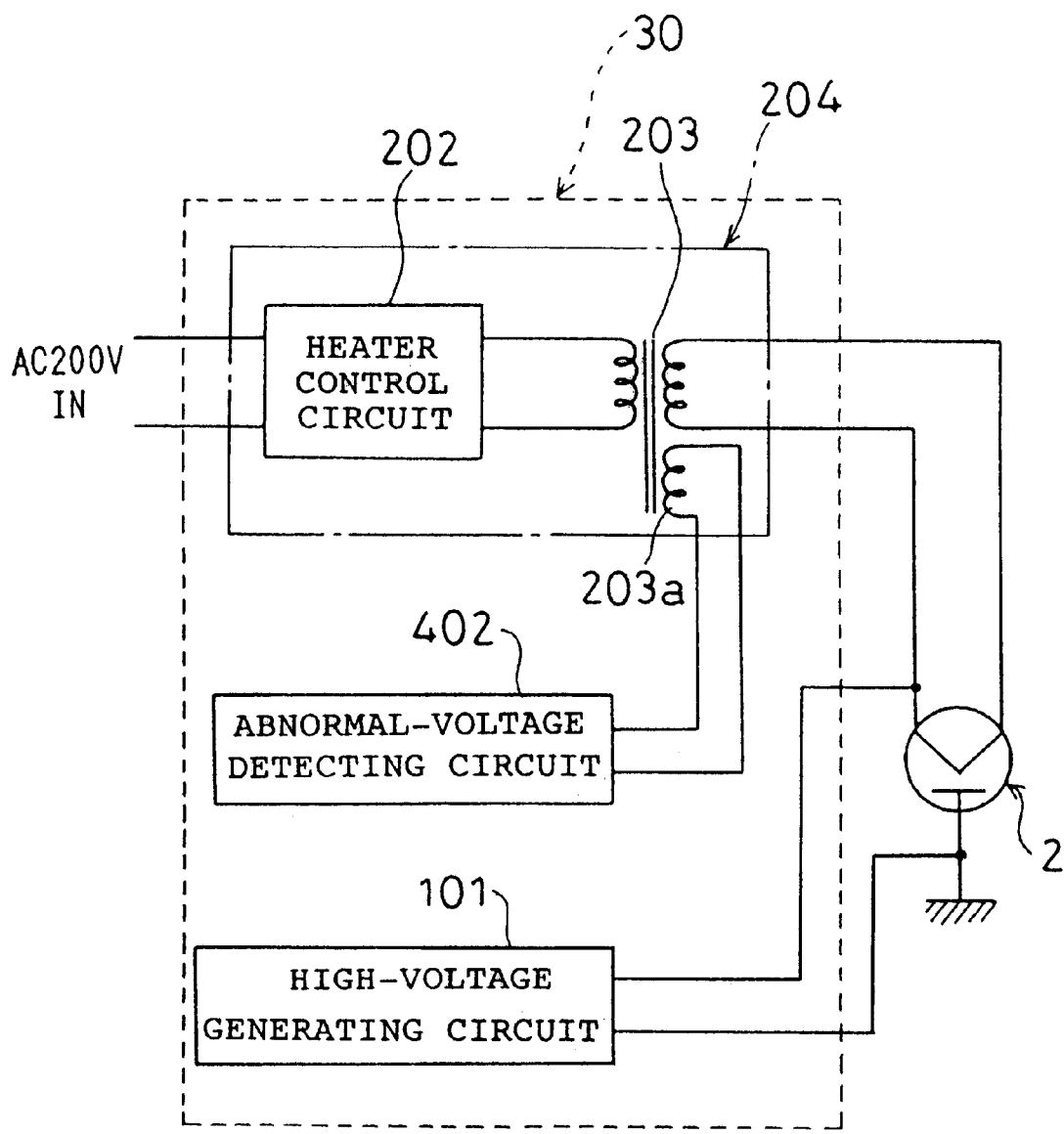
FIG. 8 is a heater circuit block diagram showing a microwave power supply apparatus according to Embodiment 3 of this invention.

Embodiment 3 of this invention is described below with reference to FIG. 8. The same members as in the previous embodiments have the same reference numerals and their description is omitted.

A microwave power supply apparatus 30 has a heater circuit 204 for applying a heater voltage to the heater section of the magnetron 2; and the high-voltage generating circuit 101 for applying a high voltage between the anode and cathode of the magnetron 2.

A single-phase 200 VAC is input to a heater control circuit 202 in the heater circuit 204, which then provides a constant output of 170 VAC. The output voltage from the heater control circuit 202 is reduced by a step-down transformer 203 down to about 3 VAC, which is then applied to the heater section of the magnetron 2.

The heater circuit of the magnetron 2 may be short- or open-circuited, and if the heater circuit is short- or open-circuited, the magnetron 2 does not oscillate. According to Embodiment 3, the step-down transformer 203 has a monitor winding 203$a$ that is a winding used to monitor and detect the heater voltage so that the abnormal-voltage detecting circuit 402 detects a decrease in detected voltage during the shorting of the heater circuit and an increase in detected voltage during its opening. As a result, a defect in the heater section of the magnetron 2 can be promptly detected.

According to Embodiment 3, the abnormal-voltage detecting circuit 402 detects an abnormal voltage via the heater-voltage-detecting monitor winding 203$a$ provided in the heater transformer 203 of the heater circuit 204 in order to enable a defect in the heater circuit of the magnetron 2 to be detected.

(Embodiment 4)

Figure 9:
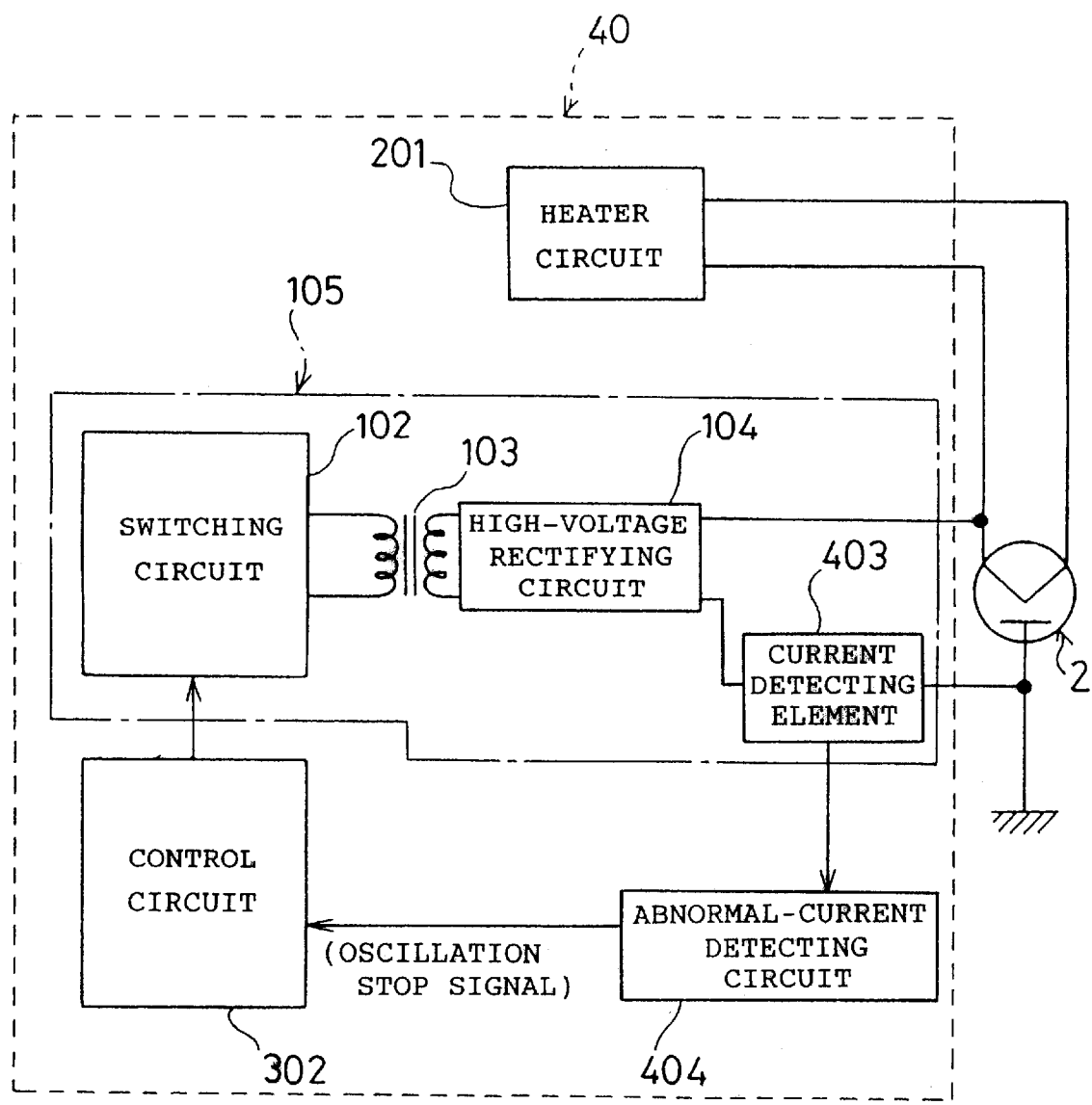
FIG. 9 is a heater circuit block diagram showing a microwave power supply apparatus according to Embodiment 4 of this invention.

Embodiment 4 of this invention is described below with reference to FIG. 9. The same members as in the previous embodiments have the same reference numerals and their description is omitted.

Several sets of a microwave power supply apparatus 40 and the magnetron 2 are provided, and the microwave power supply apparatus 40 has the heater circuit 201 for applying a heater voltage to the heater section of the magnetron 2; and the high-voltage generating circuit 105 for applying a high voltage between the anode and cathode of the magnetron 2. The high-voltage generating circuit 105 has the step-up transformer 103 that increases a voltage switched by the switching circuit 102, up to a large value at which the magnetron 2 can oscillate, and the voltage that has been increased by the step-up transformer 103 is rectified by the high-voltage rectifying circuit 104 and then applied between the anode and cathode of the magnetron 2.

Reference numeral 403 denotes a current detecting element that detects a magnetron current flowing between the anode and cathode of the magnetron 2. The internal temperature of the magnetron 2 may become abnormally high due to insufficient cooling or a mismatch with a load, and the intermediate portion between the anode and cathode is melted to cause a short circuit. At this point, an excessive magnetron current flows. Thus, when the current detecting element 403 is provided for each magnetron 2 and if the abnormal-current detecting circuit 404 detects an abnormal current, the control circuit 302 stops the operation of only that microwave power supply apparatus 40.

According to Embodiment 4, the abnormal-current detecting circuit 404 detects an abnormal value of the magnetron current via the current detecting element 403 to enable a defect between the anode and cathode of the magnetron 2 to be detected. Thus, if the intermediate portion between the anode and cathode of one magnetron 2 within the several sets of the microwave power supply apparatus 40 and magnetron 2 is short-circuited, the control circuit 302 can stop the operation of that microwave power supply apparatus 40, thereby preventing damage or spread to other microwave power supply apparatuses 40. Even when the only microwave power supply apparatus 40 for the defective magnetron 2 for which an abnormal current is detected by the abnormal-current detecting circuit 404 is stopped, the other microwave power supply apparatuses 40 serve to compensate for the loss to allow laser light to be output without changes.

(Embodiment 5)

Figure 10:
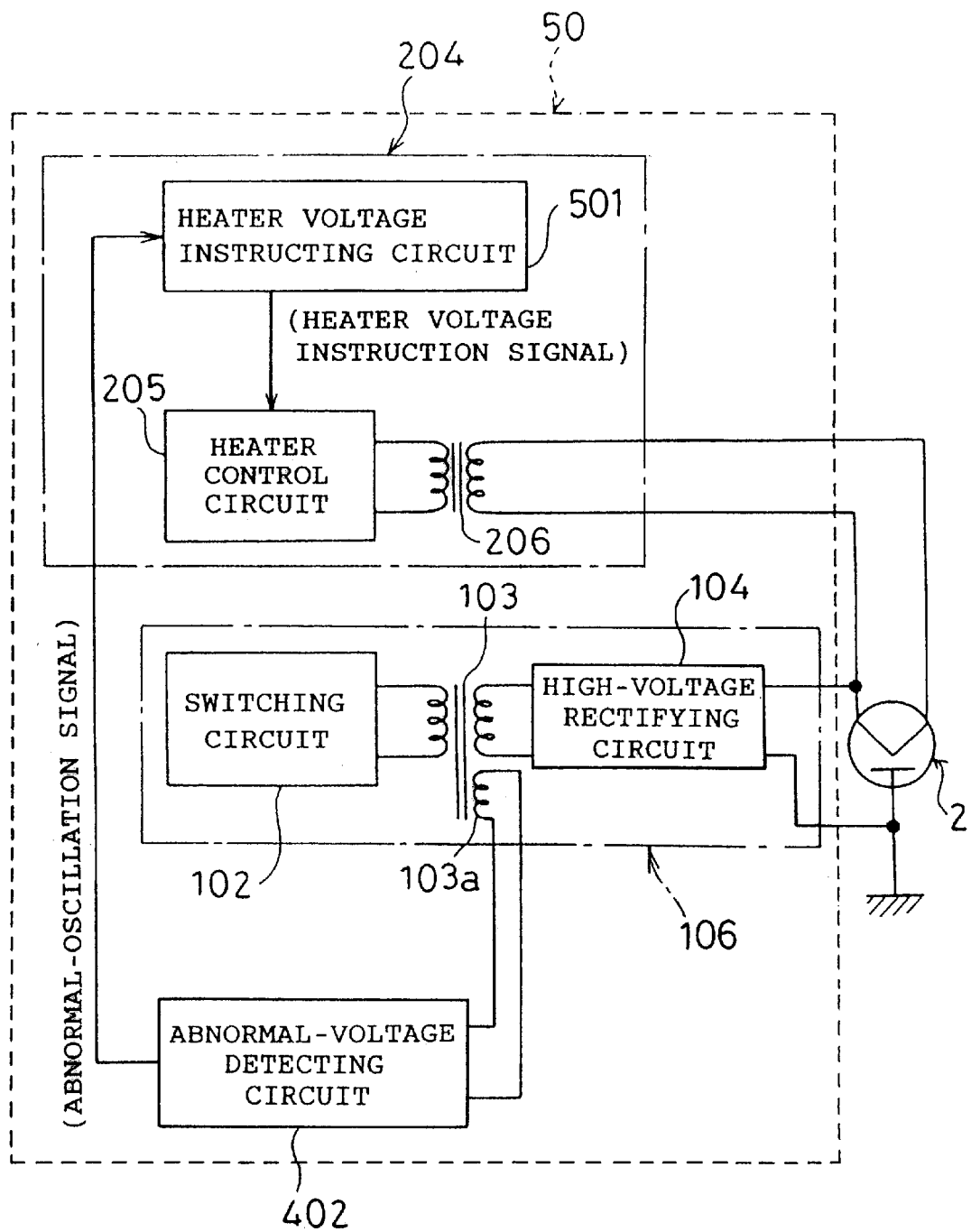
FIG. 10 is a heater circuit block diagram showing a microwave power supply apparatus according to Embodiment 5 of this invention.
Figure 11:
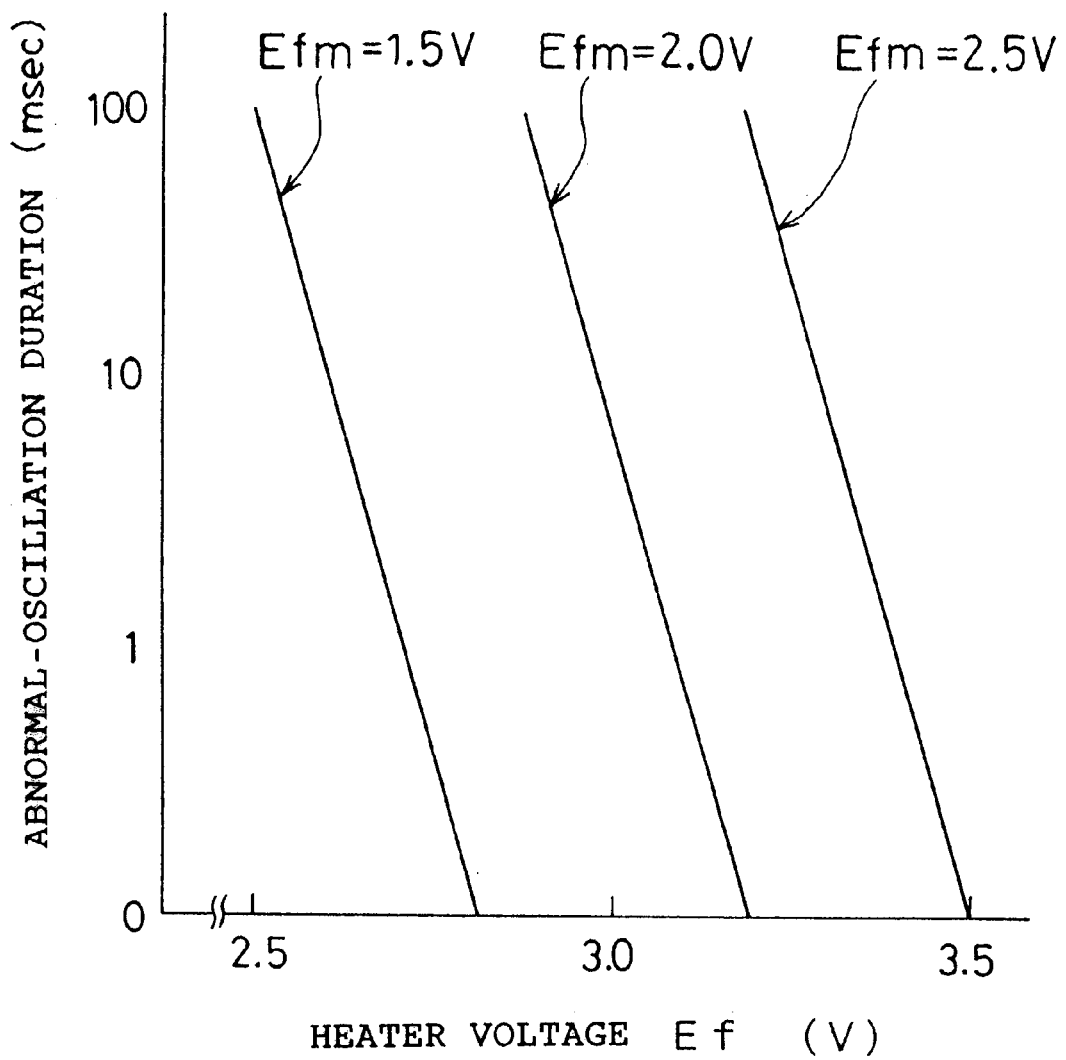
FIG. 11 is a characteristic diagram showing an abnormal-oscillation duration vs. the heater voltage of the microwave power supply apparatus.
Figure 12:
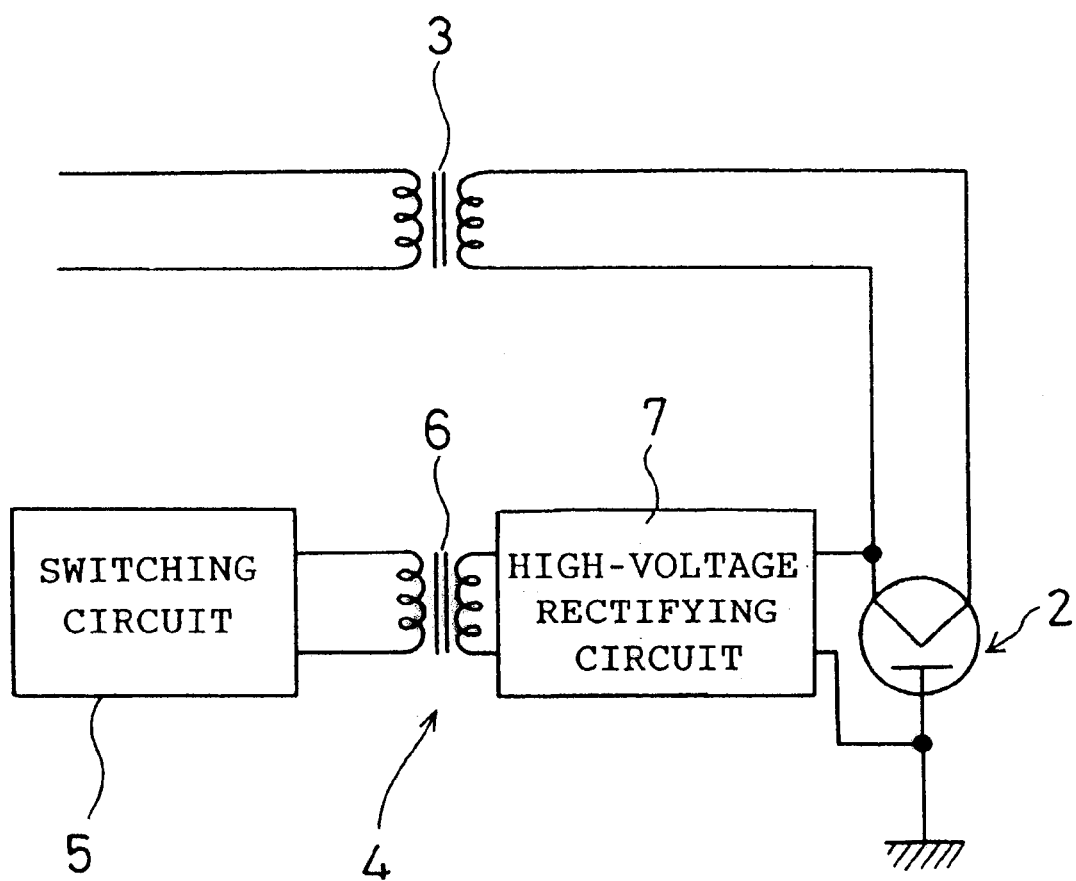
FIG. 12 is block diagram showing a conventional microwave power supply apparatus for a microwave gas laser oscillating apparatus.

Embodiment 5 of this invention is described below with reference to FIGS. 10 and 11. The same members as in the preceding embodiment have the same reference numerals and their description is omitted.

A microwave power supply apparatus 50 has the heater circuit 204 for applying a heater voltage to the heater section of the magnetron 2; and the high-voltage generating circuit 106 for applying a high voltage between the anode and cathode of the magnetron 2.

An input from an AC power supply is provided to the heater control circuit 205 of the heater circuit 204, which then outputs a constant AC voltage. The voltage of this output is reduced by the step-down transformer 206 and then applied to the heater section of the magnetron 2.

In addition, the high-voltage generating circuit 106 has the step-up transformer 103 that increases a voltage switched by the switching circuit 102, up to a large value at which the magnetron 2 can oscillate. The voltage that has been increased by the step-up transformer 103 is rectified by a high-voltage rectifying circuit 104 and then applied between the anode and cathode of the magnetron 2.

In this configuration, if the magnetron 2 is degraded and if the same heater voltage is applied, then the abnormal-oscillation duration increases. Then, however, increasing the heater voltage reduces the abnormal-oscillation duration and a further increase eliminates the abnormal oscillation.

Thus, according to Embodiment 5, an abnormal voltage caused by the abnormal oscillation of the magnetron 2 is detected by the abnormal-voltage detecting circuit 402 and the tertiary winding 103a that is an abnormal-voltage-detecting winding provided in the step-up transformer 103, which both constitute an abnormal-oscillation detecting means, thereby enabling the abnormal oscillation of the magnetron 2 to be detected, as in Embodiment 2. Furthermore, in Embodiment 5, when the abnormal-oscillation signal is transmitted to a heater voltage instructing circuit 501 in the heater circuit 204, the circuit 501 outputs a heater voltage instruction signal to the heater control circuit 205 to gradually increase the heater voltage. The heater circuit 204 uses a storage circuit provided in the heater voltage instructing circuit 501 to hold the heater voltage instruction signal obtained when the abnormal oscillation is stopped, that is, when the abnormal-oscillation signal disappears. Subsequently, the magnetron 2 is operated at that heater voltage to prevent abnormal oscillation. If the operation time has passed to degrade the magnetron 2 and abnormal oscillation occurs again, the heater voltage instructing circuit 501 further increases the heater voltage to allow operation at a heater voltage at which no abnormal oscillation occurs.

According to Embodiment 5, the abnormal-voltage detecting circuit 402 can detect via the tertiary winding 103a the abnormal voltage caused by the abnormal oscillation of the magnetron 2, and the heater voltage instructing circuit 501 can gradually increase the heater voltage. Consequently, the magnetron can be stopped with a short abnormal-oscillation duration and then operated at the heater voltage at which the abnormal oscillation is stopped, so the abnormal oscillation of the magnetron 2 can be prevented and stable oscillation can be ensured despite the degradation of the magnetron 2, thereby enabling the magnetron 2 to be used over a long period of time.

What is claimed is:

1. A microwave excitation gas laser oscillating apparatus comprising:

a discharge tube that excites a gas by means of discharge to generate a laser light;

a magnetron that supplies microwaves to said discharge tube;

a microwave power supply apparatus for supplying power to said magnetron, wherein said microwave power supply apparatus has a heater circuit for applying heater voltage to the heater of said magnetron;

a high-voltage generating circuit for applying a high voltage between the anode and cathode of said magnetron; and a power supply control means connected with said heater circuit for controlling a voltage output from said heater circuit to said magnetron in accordance with an operating condition of the magnetron, said operating condition comprising one of being stopped from oscillating, providing a continuous output, and providing an intermittent output, wherein said heater circuit is configured so that the heater voltage measured while the magnetron is providing a continuous output is lower than that measured while the oscillation of the magnetron is stopped.

2. A microwave excitation gas laser oscillating apparatus comprising:

a discharge tube that excites a gas by means of discharge to generate a laser light;

a magnetron that supplies microwaves to said discharge tube;

a microwave power supply apparatus for supplying power to said magnetron, wherein said microwave power supply apparatus has a heater circuit for applying heater voltage to the heater of said magnetron;

a high-voltage generating circuit for applying a high voltage between the anode and cathode of said magnetron; and a power supply control means connected with said heater circuit for controlling a voltage output from said heater circuit to said magnetron in accordance with an operating condition of the magnetron, said operating condition comprising one of being stopped from oscillating, providing a continuous output, and providing an intermittent output, wherein said heater circuit is configured so that the heater voltage measured while the magnetron is providing an intermittent output is lower than that measured while the oscillation of the magnetron is stopped.

3. A microwave excitation gas laser oscillating apparatus comprising:

a discharge tube that excites a gas by means of discharge to generate a laser light;

a magnetron that supplies microwaves to said discharge tube;

a microwave power supply apparatus for supplying power to said magnetron, wherein said microwave power supply apparatus has a heater circuit for applying heater voltage to the heater of said magnetron;

a high-voltage generating circuit for applying a high voltage between the anode and cathode of said magnetron; and a power supply control means connected with said heater circuit for controlling a voltage output from said heater circuit to said magnetron in accordance with an operating condition of the magnetron, said operating condition comprising one of being stopped from oscillating, providing a continuous output, and providing an intermittent output, wherein said heater circuit is configured so that the heater voltage measured while the magnetron is providing an intermittent output is higher than that measured while the magnetron is providing a continuous output and is lower than that measured while the oscillation of the magnetron is stopped.

* * * * *